US006911712B2

(12) United States Patent
Dosluoglu et al.

(10) Patent No.: US 6,911,712 B2
(45) Date of Patent: Jun. 28, 2005

(54) CMOS PIXEL USING VERTICAL STRUCTURE AND SUB-MICRON CMOS PROCESS

(75) Inventors: Taner Dosluoglu, New York, NY (US); Nathaniel Joseph McCaffrey, Stockton, NJ (US)

(73) Assignee: Dialog Semiconductor GmbH, Kirchheim (DE)

( * ) Notice: Subject to any disclaimer, the term of this patent is extended or adjusted under 35 U.S.C. 154(b) by 71 days.

(21) Appl. No.: 10/439,925

(22) Filed: May 16, 2003

(65) Prior Publication Data

US 2004/0201071 A1 Oct. 14, 2004

Related U.S. Application Data

(60) Provisional application No. 60/462,828, filed on Apr. 14, 2003.

(51) Int. Cl.[7] ............................................. H01L 27/146
(52) U.S. Cl. .................... 257/440; 257/291; 257/292; 250/332; 250/338.4; 250/370.14
(58) Field of Search ................................ 257/440, 291, 257/292; 250/332, 338.4, 370.14

(56) References Cited

U.S. PATENT DOCUMENTS 5,408,113 A  *  4/1995  Kanno et al. ............... 257/292
5,965,875 A     10/1999 Merrill ....................... 250/226
6,111,300 A      8/2000 Cao et al. ................... 257/440
6,455,833 B1     9/2002 Berezin ..................... 250/208.1
6,465,786 B1    10/2002 Rhodes ...................... 250/338.4

* cited by examiner

Primary Examiner—Jerome Jackson
(74) Attorney, Agent, or Firm—George O. Saile; Stephen B. Ackerman

(57) ABSTRACT

A CMOS pixel responsive to different colors of optical radiation without the use of color filters is described. A deep N well is formed in a P type silicon substrate. An N well is then formed at the outer periphery of the deep N well to form a P well within an N well structure. Two N+ regions are formed in the P well and at least one P+ region is formed in the N well. A layer of gate oxide and a polysilicon electrode is then formed over one of the N+ regions. The PN junction between the deep N well and the P type silicon substrate is responsive to red light. The PN junction between the deep N well and the P well is responsive to red light. The PN junction between the P well and the N+ region which is not covered by polysilicon and the PN junction formed by the N well and the P+ region are responsive to green or blue light. The PN junction formed by the junction between the P well and the N+ region which is covered by polysilicon is responsive to green light. The green signal is subtracted from the blue/green signal to produce a blue signal.

30 Claims, 4 Drawing Sheets

CMOS PIXEL USING VERTICAL STRUCTURE AND SUB-MICRON CMOS PROCESS

This Patent Application claims priority to the following U.S. Provisional Patent Application, herein incorporated by reference:

60/462,828, filed Apr. 14, 2003

BACKGROUND OF THE INVENTION

(1) Field of the Invention

This invention relates to CMOS pixels using a vertical structure and sub-micron processes. More particularly the invention relates to pixels which can detect red, green, and blue signals without the need for color filters and to pixels which use a deep N well and a P well as a gate in a vertical charge transfer active pixel sensor.

(2) Description of the Related Art

In the use of pixels for digital imagers, color filters are often used to separate color information into appropriate color signals. It is advantageous to use pixels which can provide color separation without the need for color filters.

U.S. Pat. No. 5,965,875 to Merrill describes a digital imager apparatus which uses the differences in absorption length in silicon of light of different wavelengths for color separation. A preferred imaging array is based on a three-color pixel sensor using a triple-well structure.

U.S. Pat. No. 6,111,300 to Cao et al. describes a color detection active pixel sensor. The device includes a number of doped regions. The doped regions conduct charge when receiving photons of different wavelengths.

U.S. Pat. No. 6,465,786 B1 to Rhodes describes a photodiode photosensor for use in a CMOS imager exhibiting improved infrared response.

U.S. Pat. No. 6,455,833 B1 to Berezin describes a CMOS image sensor using two or three superposed layers. Each pixel in the image sensor includes a plurality of superposed photosensitive PN junctions with individual charge integration regions.

SUMMARY OF THE INVENTION

Typically color filters are used to achieve color separation in pixels used in imagers. There is an advantage in being able to achieve color separation in pixels without the use of color filters. Color separation without the use of filters is especially important when pixel designs are implemented in sub micron CMOS, complimentary metal oxide semiconductor, processes.

It is a principle objective of this invention to provide a CMOS pixel suitable for fabrication in a sub micron CMOS process which achieves color separation without the use of color filters.

It is another principle objective of this invention to provide a pixel circuit which achieves color separation without the use of color filters.

These objectives are achieved using CMOS pixels which make use of a vertical pixel structure to take advantage of the difference in absorption coefficient of different spectral components as they travel through the silicon pixel.

A deep N well is formed in a P type silicon substrate. An N well is then formed at the outer periphery of the deep N well to form a P well within an N well structure. Two $N^+$ regions are formed in the P well and at least one $P^+$ region is formed in the N well. A layer of gate oxide and a polysilicon electrode is then formed over one of the $N^+$ regions. This structure is formed using standard CMOS processing. The PN junction formed by the junction between the deep N well and the P type silicon substrate is responsive to red light. The PN junction formed by the junction between the P well and the $N^+$ region which is not covered by polysilicon and the PN junction formed by the N well and the $P^+$ region are responsive to blue light. The PN junction formed by the junction between the P well and the $N^+$ region which is covered by polysilicon is responsive to green light, since blue light is blocked by the polysilicon. Charge accumulated at these junctions can be used to separate incident light into red, green, and blue components. The circuits used to detect the red, green, and blue components of the incident light can be structured to detect a blending of red/green and blue/green components in the incident light.

In addition to color separation the vertical structure can be used in a manner similar to a junction field effect transistor. The potential of the P well can be used to control the charge depletion of the overlap region between the N well and the deep N well. The potential of the P well can be set to deplete the charges in the overlap region and isolate the deep N well. During charge integration charge is accumulated at the deep N well P type substrate junction. During readout the potential of the P well is adjusted so that the overlap region is no longer depleted and the accumulated charge is transferred to the N well.

DESCRIPTION OF THE PREFERRED EMBODIMENTS

Figure 1A:
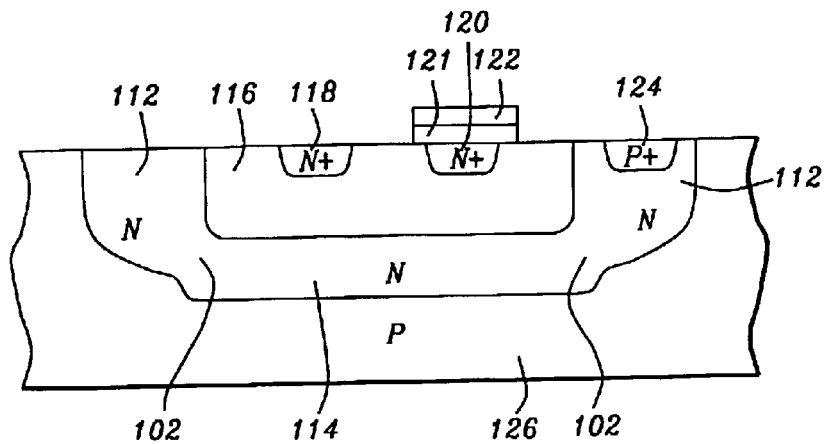
FIG. 1A shows a cross section view of a vertical structure pixel of this invention formed on a P type substrate.

Refer now to FIGS. 1A–5 of the drawings for a description of the preferred embodiments of this invention. FIG. 1A shows a cross section of the vertical APS, active pixel sensor, structure of this invention. The pixel is formed in a P type epitaxial silicon substrate 126. A deep N well 114 is formed in the substrate 126 as shown in FIG. 1A. The depth of the deep N well is the same as the penetration depth for red, infrared, and deep red light in silicon and is between about 5 and 8 microns. As an example the deep N well 114 can be formed using methods such as ion implantation. An N well 112 is formed at the periphery of the deep N well 114, extending between the top surface of the substrate 126 and the deep N well, thereby forming a P well 116 within the N well 112 and above the deep N well 114. An overlap region 102 connects the deep N well 114 and the N well 112. As another example, the structure could also be formed by first forming a large N well in the substrate and a P well 116 in the large N well thereby forming the N well 112, the deep N well 114, and the overlap region 102.

A first N⁺ region 118 and a second N⁺ region 120 are formed in the P well 116. A P⁺ region 124 is formed in the N well 112. A dielectric layer 121, such as a gate oxide, and a polysilicon layer 122 are formed over the second N⁺ region and extend far enough to cover the junction between the second N⁺ region 120 and the P well 116. The first N⁺ region 118 and the P⁺ region 124 are shallow and the PN junction between the first N⁺ region 118 and the P well 116 and the PN junction between the P⁺ 124 region and the N well 112 respond to blue or green light. Although the second N⁺ region 120 is also shallow and has the same depth as the first N⁺ region 118, the second N⁺ region 120 is covered by a layer of polysilicon 122, which blocks blue light, so that the PN junction formed by the second N⁺ region 120 in the P well 116 responds to green light.

Figure 1B:
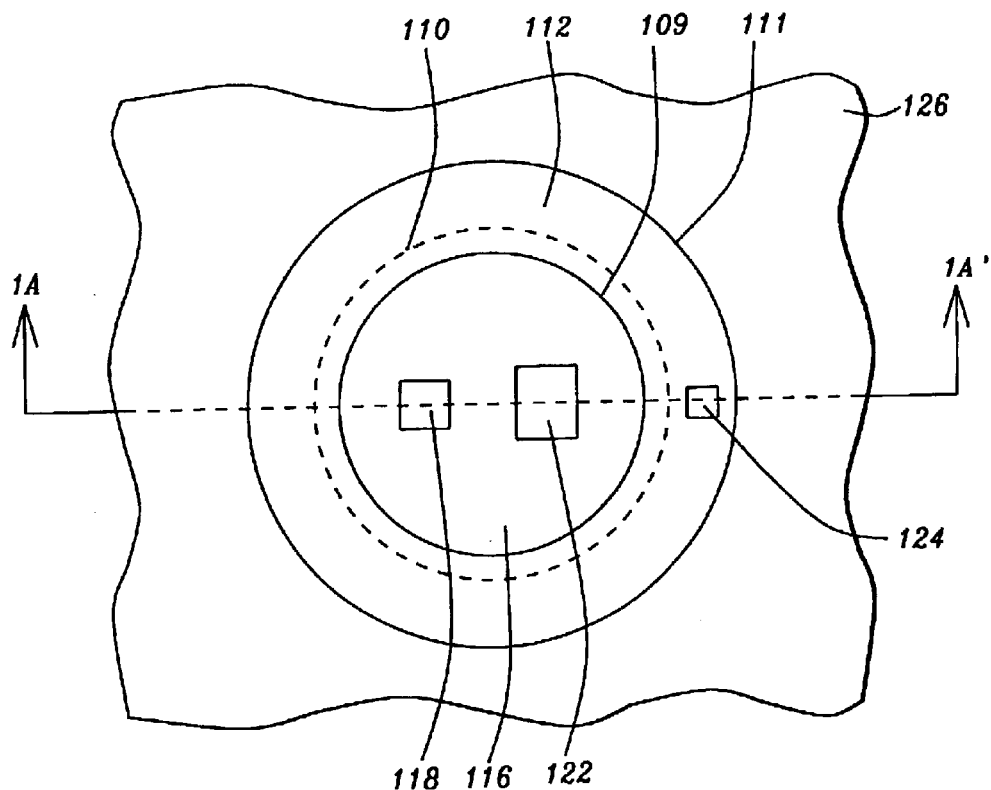
FIG. 1B shows a top view of the vertical structure pixel of FIG. 1A.

FIG. 1B shows a top view of the structure shown in FIG. 1A. FIG. 1A is a cross section view of the structure shown in FIG. 1B taken along line 1A–1A' of FIG. 1B. The periphery of the deep N well is shown as a dotted line 110 in FIG. 1B. As shown in FIG. 1B, the N well 112 has an inner periphery 109 and an outer periphery 111. FIG. 1B shows the inner periphery 109 and outer periphery 111 of the N well 112 as being essentially circular. While this example shows these peripheries to be circular, the inner periphery 109 and outer periphery 111 can have any suitable closed shape.

Figure 2:
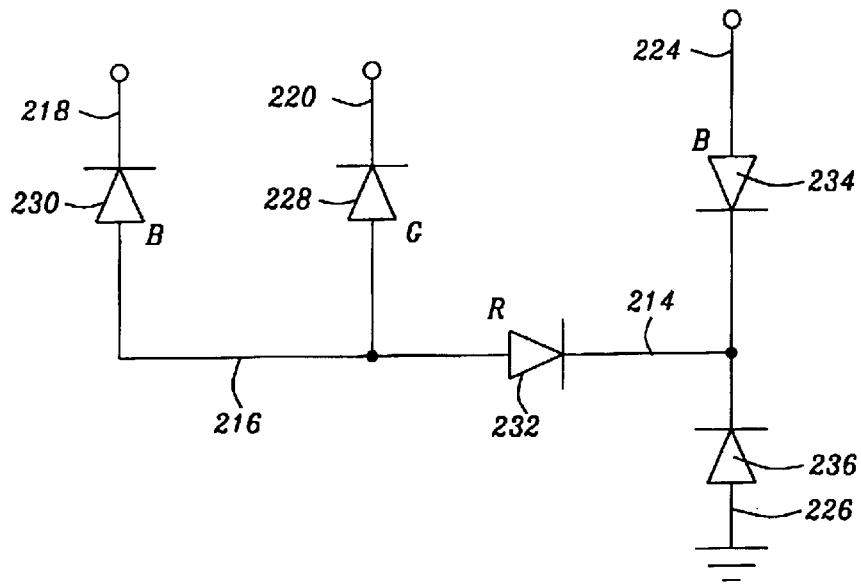
FIG. 2 shows a schematic diagram of the photosensitive diodes of the vertical structure pixel shown in FIGS. 1A and 1B.

A schematic diagram of the pixel structure of FIGS. 1A and 1B is shown in FIG. 2. In the diagram shown in FIG. 2, the combined N well/deep N well is shown as a first node 214, the P well is shown as a second node 216, the P type substrate is shown as a third node 226, the first N⁺ region is shown as a fourth node 218, the second N⁺ region is shown as a fifth node 220, and the P⁺ region is shown as a sixth node 224. The PN junction between the combined N well/ deep N well 214 and the P type substrate 226 is shown as a photodiode 236. The PN junction between the P well 216 and the combined N well/deep N well 214 is shown as a photodiode 232 and responds to red light. The PN junction between the second N⁺ region 220 and the P well 216, which is covered by a layer of polysilicon, is shown as a photodiode 228 and responds to green light. The PN junction between the P⁺ region 224 and the combined N well/deep N well 214 is shown as a photodiode 234 and responds to blue or green light. The PN junction between the first N⁺ region 218 and the P well 216 is shown as a photodiode 238 and responds to blue or green light. Appropriate circuitry, which will presently be described, can be used to extract the red, green, and blue signals or to extract combined red/green and blue/green signals.

Figure 1C:
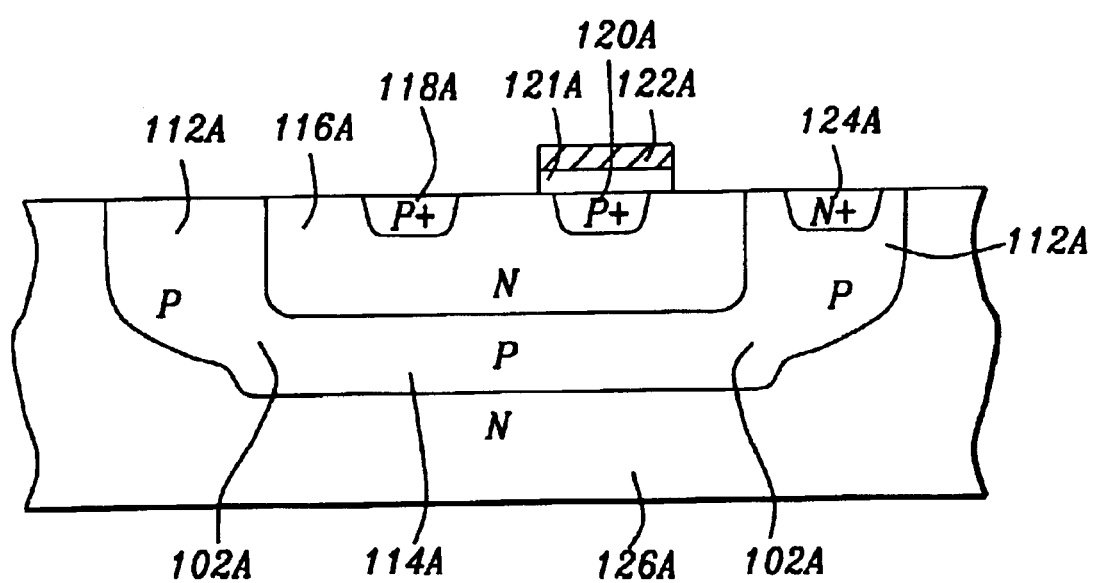
FIG. 1C shows a cross section view of a vertical structure pixel of this invention formed on an N type substrate.

As those skilled in the art will recognize, this pixel can also be formed by replacing the P type substrate by an N type substrate, the first P region by a first N region, the N regions by P regions, the N⁺ regions by P⁺ regions, and the P⁺ region by an N⁺ region. This is shown in FIG. 1C showing a deep P well 114A formed in an N type epitaxial substrate 126A. A P well 112A is formed at the periphery of the deep P well 114A, extending between the top surface of the substrate 126A and the deep P well, thereby forming an N well 116A within the P well 112A and above the deep P well 114A. An overlap region 102A connects the deep P well 114A and the P well 112A. A first P⁺ region 118A and a second P⁺ region 120A are formed in the N well 116A. An N⁺ region 124A is formed in the P well 112A. A dielectric layer 121A, such as a gate oxide, and a polysilicon layer 122A are formed over the second P⁺ region and extend far enough to cover the junction between the second P⁺ region 120A and the N well 116A. The first P⁺ region 118A and the N⁺ region 124A are shallow and the PN junction between the first P⁺ region 118A and the N well 116A and the PN junction between the N⁺ region 124A and the P well 112A respond to blue or green light. Although the second P⁺ region 120A is also shallow and has the same depth as the first P⁺ region 118A, the second P⁺ region 120A is covered by a layer of polysilicon 122A, which blocks blue light, so that the PN junction formed by the second P⁺ region 120A in the N well 116A responds to green light.

Figure 3:
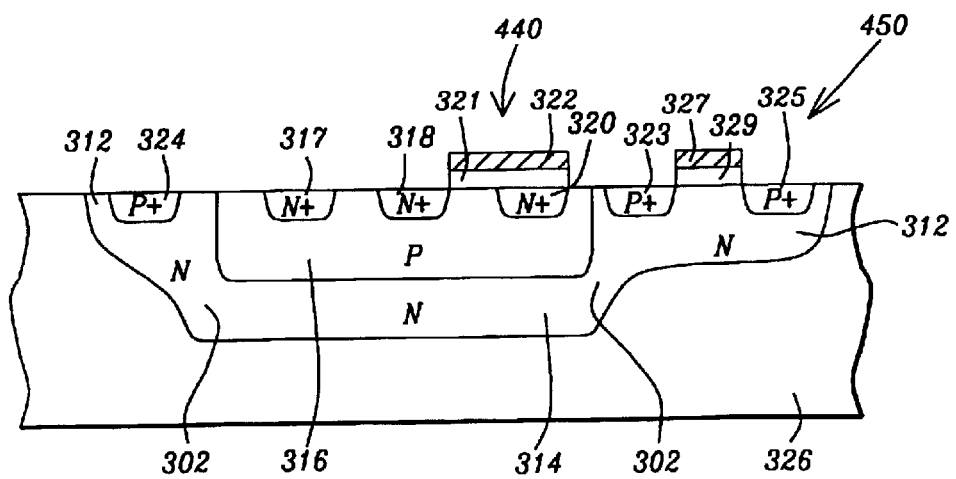
FIG. 3 shows a cross section view of another vertical structure pixel of this invention.
Figure 4:
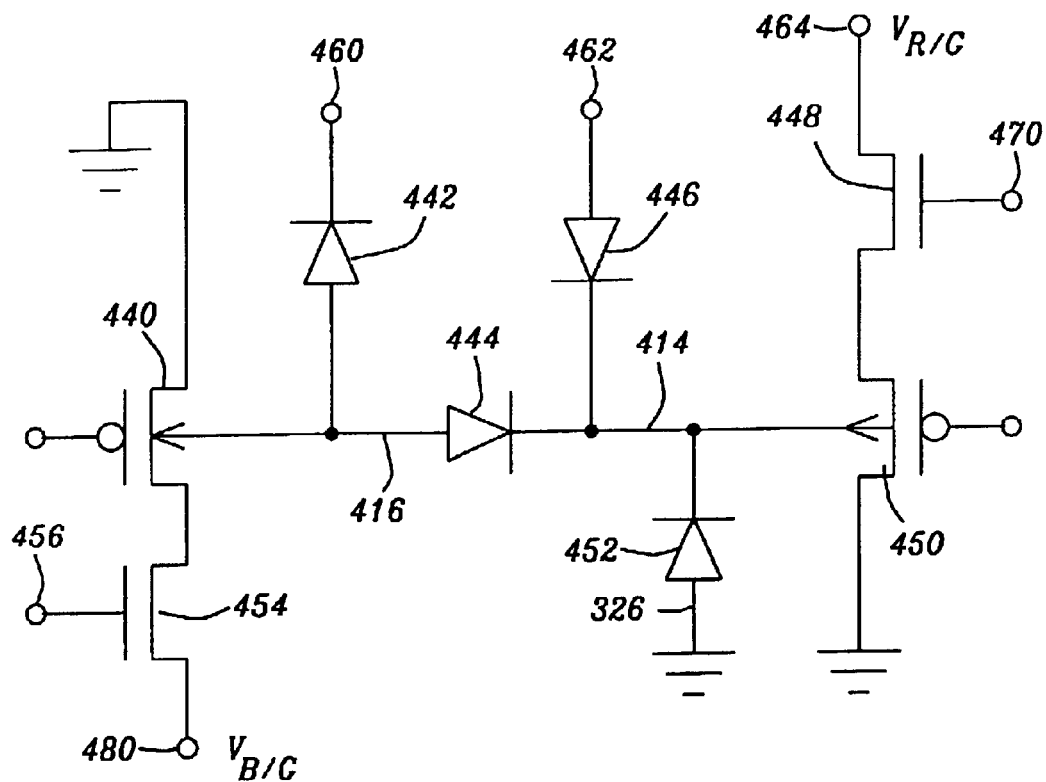
FIG. 4 shows a schematic diagram of a circuit used to implement the pixel shown in FIG. 3.
Figure 5:
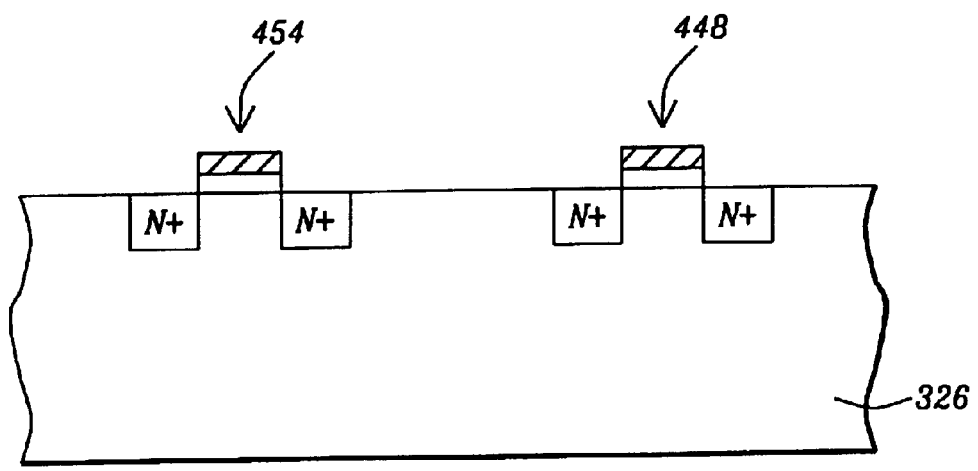
FIG. 5 shows a cross section view of a part of the P type substrate of the pixel of FIG. 3 showing two NMOS transistors formed in the P type substrate.

FIGS. 3–5 show an embodiment of a circuit which can be used with the pixel shown in FIGS. 1A–2. FIG. 3A shows a cross section view of the CMOS pixel shown in FIGS. 1A and 1B with some additions. The pixel is formed in a P type epitaxial silicon substrate 326. A deep N well 314 is formed in the substrate 326 as shown in FIG. 1A. The depth of the deep N well 314 is the same as the penetration depth of red, infrared, or deep red light in silicon. The deep N well 314 can be formed using methods such as ion implantation. An N well 312 is formed at the periphery of the deep N well 314, extending between the top surface of the substrate 326 and the deep N well 314, thereby forming a P well 316 within the N well 312 and above the deep N well 314. An overlap region 302 connects the deep N well 314 and the N well 312. The structure could also be formed by first forming a large N well in the substrate and a P well 316 in the large N well thereby forming the N well 312, the deep N well 314, and the overlap region 302.

A first N⁺ region 318 and a second N⁺ region 320 are formed in the P well 316. A first P⁺ region 324 is formed in the N well 312. A first dielectric layer 321, such as a first gate oxide, and a first polysilicon layer 322 are formed over the second N⁺ region 320 and extend far enough to cover the junction between the second N⁺ region 320 and the P well 316. The first N⁺ region 318 and the P⁺ region 324 are shallow and respond to the penetration depths of blue and green light in silicon. Although the second N⁺ region 320 is also shallow, and may have the same depth as the first N⁺ region 318, the second N⁺ region 320 is covered by a layer of polysilicon 322, which blocks blue light, so that the second N⁺ region 320 responds to green light. If the first N⁺ region 318 and the second N⁺ region have the same depth, a depth corresponding to blue and green light, the green signal can be removed from blue/green signal of the first N⁺ region 318 by subtracting the green signal of the second N⁺ region 320.

The pixel at this point is the same as the pixel previously described. In this pixel a third N⁺ region 317 is formed in the P well 316 to form a reset diode. In this pixel the first dielectric 321 layer and the first polysilicon layer 322 are made large enough to cover the channel between the first N⁺ region 318 and the second N⁺ region 320 thereby forming an NMOS transistor 440 in the P well 316. A PMOS transistor 450 is also formed in the N well 312 by forming a second P⁺ region 323, a third P⁺ region 325, a second polysilicon layer 327, and a second gate dielectric layer 329, such as a gate oxide. The PMOS transistor 450 can be used to reset the N well 312 and the deep N well 314.

The circuit of this invention will be described with reference to the cross section diagram of the structure shown in FIG. 3 and the schematic diagram for the circuit for this pixel shown in FIG. 4. In FIG. 4 the combined N well/deep N well is shown as a first node 414, the P well is shown as a second node 416, and the P type substrate is shown as a third node 426. The PN junction between the combined N well/deep N well and the P type substrate is shown as a first diode 452 which responds to red light. The PN junction between the P well and the combined N well/deep N well is shown as a second diode 444 which responds to red light. The anode of a third diode 446, formed by the junction between the first P+ region 324 and the N well 314, see FIG. 3, is connected to a first reset voltage node 462. The cathode of a fourth diode 442, formed by the junction between the third N+ region 317 and the P well 316 is connected to a second reset voltage node 460. The cathodes of the first 452, second 444, and third 446 diodes are all connected together by the first node 314 representing the combined N well/deep N well regions. The anodes of the second 444 and fourth 442 diodes are connected together by the second node 416 representing the P well 316.

A first NMOS transistor 440 is formed by the first 318 and second 320 N+ regions in the P well 316 and is responsive to blue/green light. A PMOS transistor 450 is formed by the second 323 and third 325 P+ regions in the N well 314 and is responsive to red/green light. The source of the first NMOS transistor 440 is connected to the drain of a second NMOS transistor 454. The drain of the first NMOS transistor 440 is connected to a high potential, $V_{DD}$, often the highest potential in the circuit. The drain of the PMOS transistor 450 and the P type substrate 326 are all connected to a low potential, in this example ground potential. The source of the PMOS transistor 450 is connected to the source of a third NMOS transistor 448. The source of the second NMOS transistor 454 is connected to a blue/green output node 480. The drain of the third NMOS transistor 448 is connected to a red/green output node 464. The gate of the second NMOS transistor 454 is connected to a first row select node 456. The gate of the third NMOS transistor 448 is connected to a second row select node 470.

The operation of the pixel circuit shown in FIG. 4 is a follows. During the reset cycle the second reset node 460 is set at ground potential and the first reset node 462 is set a $V_{DD}$. This back biases the first 452 and second 444 diodes. At the start of the charge integration period the first reset node 462 is set at ground potential and the second reset node 460 is set at $V_{DD}$ to back bias the third 446 and fourth 442 diodes. The potential of the P well will be responsive to optical radiation in the blue and green range and the first NMOS source follower transistor will generate a signal representing a combination of the blue and green radiation. A blue/green signal can be extracted at the blue/green output node 480 when the second NMOS transistor 454 is turned on by a signal at the first row select node 456. The potential of the combined N well/deep N well will be responsive to optical radiation in the red and green range and the PMOS source follower transistor 450 will generate a signal representing a combination of the red and green radiation. A red/green signal can be extracted at the red/green output node 464 when the third NMOS transistor 448 is turned on by a signal at the second row select node 470. As shown in FIG. 5, the second 454 and third 448 NMOS transistors can be formed in the P type substrate 326 outside the N well, deep N well, and P well.

Refer again to FIGS. 1A and 1B. The structure shown in FIGS. 1A and 1B can also be used as vertical charge transfer APS, active pixel sensor. In this mode of operation the overlap region 102 is intentionally designed to be smaller, so that when the P well 116 is set to a reasonable negative bias the overlap region 102 is totally depleted even when the deep N well 114 is at its minimum potential of zero volts, thereby isolating the deep N well 114. In this mode of operation the charge depletion in the overlap region 102 is controlled by the potential of the P well 116. To reset the pixel in this operational mode the N well 112 is set to the reset voltage while the P well 116 is held at a positive voltage, so that the overlap region 102 is not depleted, and the deep N well 114 is set to the reset voltage via the overlap region 102. The P well 116 is then set to a negative voltage depleting the overlap region 102 and isolating the deep N well 114. The deep N well is then isolated and set to the reset voltage. During the charge integration cycle the potential of the deep N well 114 changes due to electron hole pairs generated by incoming light intensity. During the readout cycle the potential of the P well 116 is set to a positive voltage, the overlap region 102 is no longer depleted, and the potential of the deep N well 114 is transferred to the N well 112 where it can be read out.

This ability to deplete the overlap region 102 also allows the pixel to be used in a snapshot mode. After the potential of the deep N well 114 is transferred to the N well 112 the overlap region 102 can again be depleted so that the potential can be stored in the N well 112 until it is read out.

While the invention has been particularly shown and described with reference to the preferred embodiments thereof, it will be understood by those skilled in the art that various changes in form and details may be made without departing from the spirit and scope of the invention.

What is claimed is:

1. A pixel structure, comprising:
   a substrate of a first conductivity type silicon;
   a first well of a second conductivity type silicon formed in said substrate, wherein said first well is a distance below the top surface of said substrate, and the polarity of said second conductivity type is opposite to the polarity of said first conductivity type;
   a second well of said second conductivity type silicon formed in said substrate, wherein the top surface of said second well is the top surface of said substrate and said second well has an inner periphery and an outer periphery;
   an overlap region of said second conductivity type silicon between said first well and said second well, wherein the size of said overlap region is such that said overlap region can be depleted to electrically isolate said first well from said second well or not depleted to electrically connect said first well and said second well as desired;
   a third well of said first conductivity type silicon in the region within said inner periphery of said second well and between the top surface of said substrate and said first well, wherein said first well and said second well isolate said third well from said substrate;
   a first region of said second conductivity type silicon formed in said third well, wherein the top surface of said substrate forms the top surface of said first region;
   a second region of said second conductivity type silicon formed in said third well, wherein the top surface of said substrate forms the top surface of said second region; and
   a third region of said first conductivity type silicon formed in said second well, wherein the top surface of said substrate forms the top surface of said third region.

2. The pixel structure of claim 1 wherein said first conductivity type silicon is P type silicon.

3. The pixel structure of claim 1 wherein said second conductivity type is N type silicon.

4. The pixel structure of claim 1 wherein the junction between said first well and said substrate has a good response to radiation having wavelengths at or near the wavelength for red light.

5. The pixel structure of claim 1 wherein the junction between said first region and said third well and the junction between said third region and said second well have a good response to radiation having wavelengths at or near the wavelength for blue light.

6. The pixel structure of claim 1 wherein the junction between said first region and said third well and the junction between said third region and said second well are used to reset the pixel.

7. The pixel structure of claim 1, further comprising:
a layer of dielectric formed over said second region of said second conductivity type silicon; and
a layer of polysilicon formed over said layer of dielectric and covering said second region of said second conductivity type silicon.

8. The pixel structure of claim 7, wherein the junction between said second region and said third well has a good response to radiation having wavelengths at or near the wavelength for green light.

9. The pixel structure of claim 1 wherein the amount of carrier depletion in, and thereby the conductivity of, said overlap region is determined by the potential of said third well.

10. A CMOS pixel structure, comprising:
a substrate formed of P type epitaxial silicon;
a first N well, formed of N type silicon, in said substrate, wherein said first N well is a distance below the top surface of said substrate;
a second N well formed of N type silicon in said substrate, wherein the top surface of said second N well is the top surface of said substrate and said second N well has an inner periphery and an outer periphery;
an overlap region of N type silicon between said first N well and said second N well, wherein the size of said overlap, region is such that said overlap region can be depleted to electrically isolate said first N well from said second N well or not depleted to electrically connect said first N well to said second N well as desired;
a P well formed of P type silicon within the inner periphery of said second N well and between the top surface of said substrate and said first N well;
a first $N^+$ region formed of $N^+$ type silicon in said P well, wherein the top surface of said substrate forms the top surface of said first $N^+$ region;
a second $N^+$ region formed of $N^+$ type silicon formed in said P well, wherein the top surface of said substrate forms the top surface of said second $N^+$ region; and
a first $P^+$ region, formed of $P^+$ type silicon in said second N well, wherein the top surface of said substrate forms the top surface of said first $P^+$ region.

11. The CMOS pixel structure of claim 10 wherein the PN junction between said first N well and said P type substrate responds to red light.

12. The CMOS pixel structure of claim 10 wherein the PN junction between said first $N^+$ region and said P well and the PN junction between said first $P^+$ region and said second N well respond to blue or green light.

13. The CMOS pixel structure of claim 10 wherein the PN junction between said first $N^+$ region and said P well and the PN junction between said first $P^+$ region and said second N well are used to reset the pixel.

14. The CMOS pixel structure of claim 10, further comprising:

a layer of dielectric formed over said second $N^+$ region; and
a layer of polysilicon formed over said layer of dielectric and covering said second $N^+$ region.

15. The CMOS pixel structure of claim 14, wherein the PN junction between said second $N^+$ region and said P well responds to green light.

16. The CMOS pixel structure of claim 10 wherein the amount of carrier depletion in, and thereby the conductivity of, said overlap region is determined by the potential between said P well and said substrate.

17. The CMOS pixel structure of claim 10 further comprising a PMOS transistor formed in said second N well.

18. The CMOS pixel structure of claim 10 further comprising an NMOS transistor formed in said P well.

19. The CMOS pixel structure of claim 10 wherein during the reset cycle the potential between said P well and said substrate is adjusted so that said overlap region is not depleted and the potential of said first N well is set to a reset voltage.

20. The CMOS pixel structure of claim 10 wherein during the charge accumulation cycle the potential between said P well and said substrate is adjusted so that said overlap region is depleted and said first N well is isolated.

21. The CMOS pixel structure of claim 10 wherein during the readout cycle the potential between said P well and said substrate is adjusted so that said overlap region is not depleted and the potential of said first N well is transferred to said second N well.

22. A pixel circuit, comprising:
a P type substrate connected to ground potential;
an N well formed in said P type substrate, wherein the PN junction between said N well and said P type substrate forms a first diode;
a P well formed in said N well wherein a part of said N well lies below said P well and the PN junction between said P well and said N well forms a second diode;
a PMOS transistor formed in said N well, wherein the drain of said PMOS transistor is connected to ground potential;
a first NMOS transistor formed in said P well wherein the drain of said first NMOS transistor is connected to a high potential, $V_{DD}$;
a second NMOS transistor wherein the drain of said second NMOS transistor is connected to the source of said first NMOS transistor;
a third NMOS transistor wherein the source of said third NMOS transistor is connected to the source of said PMOS transistor;
a third diode connected between said N well and a first reset voltage node, wherein the anode of said third diode is connected to said N well and the cathode of said third diode is connected to said first reset voltage source; and
a fourth diode connected between said P well and a second reset voltage node, wherein the cathode of said third diode is connected to said P well and the anode of said third diode is connected to said second reset voltage source.

23. The pixel circuit of claim 22 wherein said first NMOS transistor and said PMOS transistor are operated as source follower transistors.

24. The pixel circuit of claim 22 wherein said second NMOS transistor and said third NMOS transistor are formed in said P type substrate.

25. The pixel circuit of claim 22 wherein said third diode is formed in said N well.

26. The pixel circuit of claim 22 wherein said fourth diode is formed in said P well.

27. The pixel circuit of claim 22 wherein during the reset cycle said first reset voltage node is set at a high potential, $V_{DD}$, and said second reset voltage node is set at ground potential.

28. The pixel of claim 22 wherein during the charge integration cycle said first reset voltage node is set at ground potential and said second reset voltage node is set at a high potential, $V_{DD}$.

29. The pixel of claim 22 wherein during the readout cycle a red/green signal is taken form the drain of the third NMOS transistor.

30. The pixel of claim 22 wherein during the readout cycle a blue/green signal is taken from the source of the second NMOS transistor.

* * * * *